(12) United States Patent
Tan et al.

(10) Patent No.: US 9,853,642 B1
(45) Date of Patent: Dec. 26, 2017

(54) DATA-DEPENDENT CURRENT COMPENSATION IN A VOLTAGE-MODE DRIVER

(71) Applicant: Xilinx, Inc., San Jose, CA (US)

(72) Inventors: Kee Hian Tan, Singapore (SG); Kok Lim Chan, Singapore (SG); Siok Wei Lim, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/234,667

(22) Filed: Aug. 11, 2016

(51) Int. Cl.
| | |
|---|---|
| *H03K 3/00* | (2006.01) |
| *H03K 19/0185* | (2006.01) |
| *H03H 17/06* | (2006.01) |
| *H03M 9/00* | (2006.01) |
| *H04L 25/03* | (2006.01) |

(52) U.S. Cl.
CPC ..... *H03K 19/018521* (2013.01); *H03H 17/06* (2013.01); *H03M 9/00* (2013.01); *H04L 25/03343* (2013.01)

(58) Field of Classification Search
CPC ..... H03K 19/018521; H04L 25/03343; H03M 9/00; H03H 17/06
See application file for complete search history.

(56) References Cited

U.S. PATENT DOCUMENTS

| | | | | |
|---|---|---|---|---|
| 5,949,253 A * | 9/1999 | Bridgewater, Jr. | | H03K 19/0016 326/27 |
| 6,366,128 B1 * | 4/2002 | Ghia | ..................... | H03K 5/151 326/40 |
| 6,888,389 B2 * | 5/2005 | Baba | ..................... | H03H 11/265 327/261 |
| 6,940,302 B1 * | 9/2005 | Shumarayev | .. | H03K 19/018585 326/115 |
| 7,215,148 B1 * | 5/2007 | Johnson | .............. | H03F 3/45237 326/83 |
| 7,307,446 B1 * | 12/2007 | Shumarayev | ............ | H03K 5/06 326/115 |
| 7,528,635 B2 * | 5/2009 | Kwasniewski | ..... | H04L 25/0286 326/86 |
| 8,030,967 B1 * | 10/2011 | Tan | ................ | H03K 19/017581 326/83 |
| 8,228,096 B2 * | 7/2012 | Nishi | .................. | H04L 25/0278 326/83 |
| 2013/0163126 A1 * | 6/2013 | Dong | .................. | G06F 13/4086 361/56 |

* cited by examiner

*Primary Examiner* — Kenneth B Wells
(74) *Attorney, Agent, or Firm* — Robert M. Brush; Keith Taboada

(57) ABSTRACT

An example output driver includes a plurality of output circuits coupled in parallel between a first voltage supply node and a second voltage supply node. Each of the plurality of output circuits includes a differential input that is coupled to receive a logic signal of a plurality of logic signals and a differential output that is coupled to a common output node. The output driver further includes voltage regulator(s), coupled to the voltage supply node(s), and a current compensation circuit. The current compensation circuit includes a switch coupled in series with a current source, where the switch and the current source are coupled between the first voltage supply node and the second voltage supply node. An event detector is coupled to the switch to supply an enable signal and to control state of the enable signal based on presence of a pattern in the plurality of logic signals.

17 Claims, 5 Drawing Sheets

|  | 2n+1 | 2n+2 | 2n+3 | 2n+4 | 2n+5 | 2n+6 | 2n+7 | 2n+8 | 2n+9 | 2n+10 |
|---|---|---|---|---|---|---|---|---|---|---|
| 1T Main | 0 | 0 | 1 | 1 | 1 | 0 | 0 | 0 | 1 | 0 |
| 2T Main Odd | 0 |  | 1 |  | 1 |  | 0 |  | 1 |  |
| 2T Post Odd | 0 |  | 1 |  | 0 |  | 0 |  | 0 |  |
| 2T Pre Odd |  |  | 0 |  | 1 |  | 0 |  | 0 |  |

FIG. 5A

|  | 2n+1 | 2n+2 | 2n+3 | 2n+4 | 2n+5 | 2n+6 | 2n+7 | 2n+8 | 2n+9 | 2n+10 |
|---|---|---|---|---|---|---|---|---|---|---|
| 1T Main | 0 | 0 | 1 | 1 | 1 | 0 | 0 | 0 | 1 | 0 |
| 2T Main Even |  | 0 |  | 1 |  | 0 |  | 0 |  | 0 |
| 2T Post Even |  | 1 |  | 1 |  | 0 |  | 1 |  |  |
| 2T Pre Even |  | 0 |  | 1 |  | 1 |  | 0 |  | 1 |

FIG. 5B

DATA-DEPENDENT CURRENT COMPENSATION IN A VOLTAGE-MODE DRIVER

TECHNICAL FIELD

Examples of the present disclosure generally relate to electronic circuits and, in particular, to data-dependent current compensation in a voltage-mode driver.

BACKGROUND

In serial communication systems, a large percentage of the total power is consumed in the transmitter, which must provide for adequate signal swing on a low-impedance channel while maintaining an appropriate source termination. In addition, the transmitter often includes equalization to compensate for frequency-dependent loss in the channel. The driver circuit in the transmitter often consumes the majority of the power of the transmitter. Driver circuits can be implemented as current-mode drivers or voltage-mode drivers. Voltage-mode drivers are known to consume far less power in comparison to current-mode drivers. For example, a voltage-mode driver can consume four times less DC power than a current-mode driver to provide the same output swing.

A transmitter can include a plurality of voltage-mode drivers coupled to a common output node. A voltage regulator provides a regulated supply voltage to the voltage-mode drivers. The voltage-mode drivers are driven by different input signals to implement equalization. Thus, the voltage-mode drivers draw a data-dependent current from the voltage regulator. Large swings in the average supply current can degrade the deterministic jitter of the transmitter.

SUMMARY

Techniques for data-dependent current compensation in a voltage-mode driver are described. In an example, an output driver includes a plurality of output circuits coupled in parallel between a first voltage supply node and a second voltage supply node. Each of the plurality of output circuits includes a differential input that is coupled to receive a logic signal of a plurality of logic signals and a differential output that is coupled to a common output node. The output driver further includes at least one voltage regulator coupled to a respective at least one of the first voltage supply node and the second voltage supply node. The output driver further includes a current compensation circuit. The current compensation circuit includes a switch coupled in series with a current source, where the series combination of the switch and the current source is coupled between the first voltage supply node and the second voltage supply node. The current compensation circuit further includes an event detector coupled to the switch to supply an enable signal, where the event detector is configured to control state of the enable signal based on presence of a pattern in the plurality of logic signals.

In another example, a transmitter includes a finite impulse response (FIR) filter configured to supply a plurality of logic signals in response to input data. The transmitter further includes a pre-driver configured to couple the plurality of logic signals to an output driver. The output driver includes a plurality of output circuits coupled in parallel between a first voltage supply node and a second voltage supply node, where each of the plurality of output circuits includes a differential input that is coupled to receive a logic signal of the plurality of logic signals and a differential output that is coupled to a common output node. The output driver further includes at least one voltage regulator coupled to a respective at least one of the first voltage supply node and the second voltage supply node. The output driver further includes a current compensation circuit. The current compensation circuit includes a switch coupled in series with a current source, where the series combination of the switch and the current source is coupled between the first voltage supply node and the second voltage supply node. The current compensation circuit further includes an event detector coupled to the switch to supply an enable signal, where the event detector is configured to control state of the enable signal based on presence of a pattern in the plurality of logic signals.

In another example, a method of controlling an output driver in a transmitter includes receiving a plurality of logic signals from an equalizer in the transmitter, coupling each of the plurality of logic signals to at least one of a plurality of output circuits of the output driver, the plurality of output circuits coupled between a first voltage supply node and a second voltage supply node, at least one of the first voltage supply node and the second voltage supply node coupled to a voltage regulator, detecting a pattern in the plurality of logic signals, and enabling at least one of a plurality of current sources coupled between the first voltage supply node and the second voltage supply node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5A is a table illustrating an example portion of a 1T main-cursor signal and its associated 2T odd signals.

FIG. 5B is a table illustrating an example portion of a 1T main-cursor signal and its associated 2T even signals.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
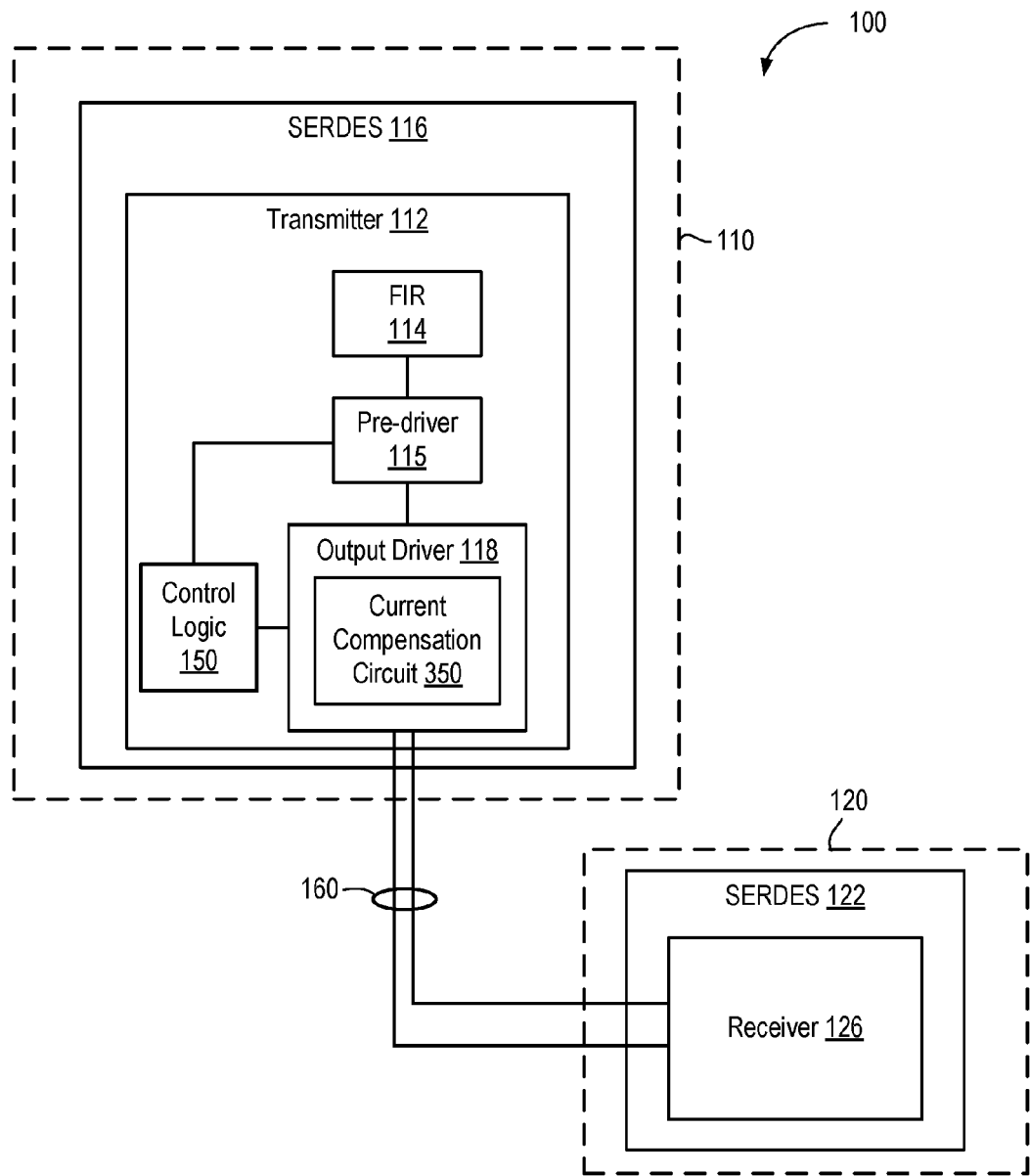
FIG. 1 is a block diagram depicting an example of a serial communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SERDES) 116. The receiver 126 can be part of a SERDES 122. The transmission medium 160 comprises an electrical path between the transmitter 112 and the receiver 126 and can include printed circuit board (PCB) traces, vias, cables, connectors, decoupling capacitors, and the like. In examples, the transmission medium 160 includes a matched pair of transmission lines each having a characteristic impedance ($Z_0$). The receiver of the SERDES 116, and the transmitter of the SERDES 122, are omitted for clarity. In some examples, the SERDES 116 can be disposed in an integrated circuit (IC) 110, and the SERDES 122 can be disposed in an IC 120.

In operation, the SERDES 116 serializes an input digital signal. As used herein, a digital signal is a sequence of k-bit codes, where k is a positive integer. A k-bit code may be referred to as a word (or data word). In specific examples, an 8-bit code may be referred to as a byte (or data byte). The number of codes per second is the data rate (also referred to as sample rate). A digital signal can also be conceptually viewed as a discrete-time, discrete-amplitude signal, where the amplitude of the signal at each discrete time is selected from $2^k$ discrete values. As used herein a logic signal is a sequence of 1-bit codes. A logic signal can be viewed as a discrete-time, discrete amplitude signal, where the amplitude of the signal at each discrete time is selected from two states referred to as logic high (or logic "1") and logic low (or logic "0"). The input signal is serialized by decomposing each k-bit code at a discrete time into a sequence of j bits over j discrete times (referred to as serial data), where j is a positive integer greater than or equal to k. In some examples, data words provided by the input digital signal can be encoded prior to serialization using, for example, an 8B/10B encoder or any other line-coding scheme (e.g., j>k).

The SERDES 116 generates one or more logic signals to provide the serial data to the transmitter 112. The transmitter 112 drives the serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In the examples described herein, the transmitter 112 uses a binary non-return-to-zero (NRZ) modulation scheme. In binary NRZ, a symbol is one bit of the serial data and two analog voltages are used to represent each bit. Those skilled in the art will appreciate that the techniques described herein can also be used with other digital baseband modulation techniques, such as pulse amplitude modulation (PAM), where a symbol includes a plurality of bits of the serial data.

In the example shown, the transmission medium 160 is a differential channel. Analog voltage is coupled to the transmission medium 160 using two complementary analog signals (referred to as positive and negative analog signals). For binary NRZ, a logic "0" of the serial data is represented by driving the transmission medium 160 with the positive analog signal at its lower voltage limit and the negative analog signal at its upper voltage limit. A logic "1" of the serial data is represented by driving the transmission medium 160 with the positive analog signal at its upper voltage limit and the negative analog signal to its lower voltage limit. Thus, the logic value of each bit of the serial data is based on the difference between the positive and negative analog signals, and not based on the level of either analog signal individually. The peak-to-peak difference between the positive analog signal and the negative analog signal is the voltage swing (also referred to as output swing or swing). The two complementary analog signals form a differential signal (also referred to as the transmitted signal).

The transmitter 112 includes a finite impulse response (FIR) filter 114, a pre-driver 115, an output driver 118, and control logic 150. The transmitter 112 is configured to process the serial data to pre-emphasize the transmitted signal and equalize the transmission medium 160. The FIR 114 can be used to mitigate inter-symbol interference (ISI) caused by the transmission medium 160. The transmission medium 160 degrades the signal quality of the transmitted signal. Channel insertion loss is the frequency-dependent degradation in signal power of the transmitted signal. When signals travel through a transmission line, the high frequency components of the transmitted signal are attenuated more than the low frequency components. In general, channel insertion loss increases as frequency increases. Signal pulse energy in the transmitted signal can be spread from one symbol period to another during propagation on the transmission medium 160. The resulting distortion is known as ISI. In general, ISI becomes worse as the speed of the communication system increases. The transmitter 112 uses pre-emphasis to equalize the transmission medium 160.

The output of the FIR filter 114 is coupled to an input of the pre-driver 115. An output of the pre-driver 115 is coupled to an input of the output driver 118. An output of the output driver 118 is coupled to the transmission medium 160. In operation, the FIR filter 114 receives the serial data. The FIR filter 114 includes a plurality of taps each providing a state of the serial data at different discrete times. In an example, the FIR filter 114 includes three taps, where one tap provides a current symbol of the serial data, another tap provides a delayed symbol of the serial data, and another tap provides an advanced symbol of the serial digital signal. The current, delayed, and advanced symbols are referred to as the main-cursor, the pre-cursor, and the post-cursor, respectively. The FIR filter 114 outputs a plurality of logic signals generated from the main-, pre-, and post-cursors, as described further below. While the FIR filter 114 is described has having three taps, in general, the FIR filter 114 can include a plurality of taps that provide a main-cursor, as well as one or more pre-cursors and/or one or more post-cursors.

The pre-driver 115 couples the logic signals output by the FIR filter 114 to the output driver 118. As discussed below, the output driver 118 is segmented and includes a plurality of output circuits coupled to the transmission medium 160. Each of the output circuits includes a series-source terminated (SST) output driver (e.g., a voltage-mode driver). The pre-driver 115 multiplexes the logic signals output by the FIR filter 114 among the output circuits to provide each of the main-, pre-, and post-cursors to a respective percentage of the output circuits. The numbers of the output circuits driven by the main-cursor, pre-cursor, and post-cursor are selected by the control logic 150 to provide a selected pre-emphasis to the transmitted signal for equalizing the transmission medium 160.

In the example, the output driver 118 couples a differential signal to the transmission medium 160. The output circuits in the output driver 118 draw a data-dependent current from voltage regulator(s). A change in the average supply current can degrade deterministic jitter (DJ) of the transmitter. Accordingly, the output driver 118 includes a current compensation circuit 350 that ensures a constant average current is drawn from the voltage regulator(s). The current compensation circuit 350 is described below.

While the SERDES 116 and the SERDES 122 are shown, in other examples, each of the transmitter 112 and/or the receiver 126 can be a stand-alone circuit not being part of a larger transceiver circuit. In some examples, the transmitter 112 and the receiver 126 can be part of one or more ICs, such as application specific integrated circuits (ASICs) or programmable ICs, such as field programmable gate arrays (FPGAs).

Figure 2:
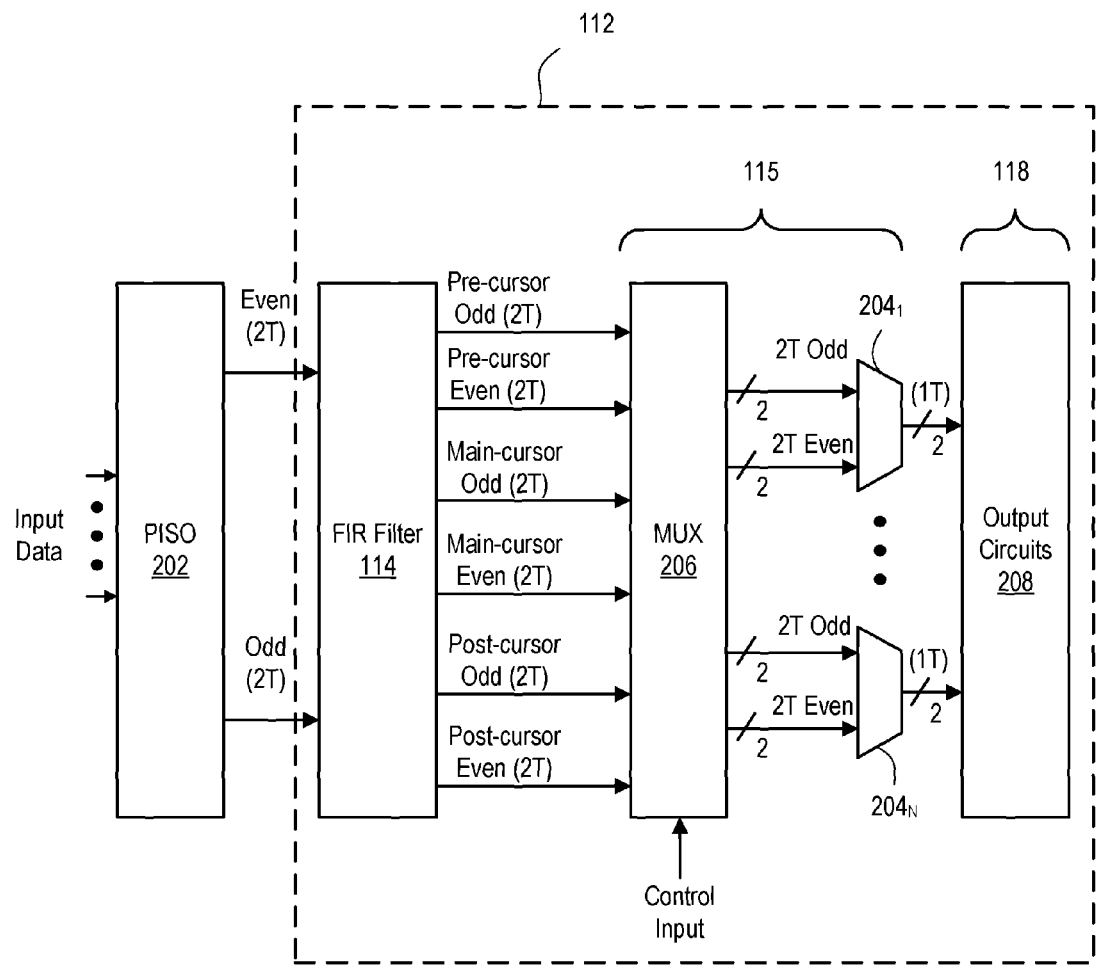
FIG. 2 is a block diagram depicting a portion of a transmitter according to an example.

FIG. 2 is a block diagram depicting the transmitter 112 according to an example. An input of the transmitter 112 is coupled to a parallel-in-serial-out (PISO) circuit 202 of the SERDES 116. The PISO circuit 202 includes a parallel input to receive a digital signal to be transmitted. The PISO circuit 202 serializes the digital signal to generate serial data. In the example, the PISO circuit 202 outputs two logic signals referred to as the even signal and the odd signal. The even signal includes every even symbol of the serial data, and the odd signal includes every odd symbol of the serial data. In the examples described herein, each symbol is 1-bit of the serial data hence the terms symbol and bit are used interchangeably for these examples. If the transmitter 112 is configured to use a multi-bit symbol modulation scheme, such as PAM, each symbol would include a plurality of bits. The serial data includes a period T between symbols (a symbol rate 1/T). Each of the even signal and the odd signal has a period 2T (a data rate 1/(2T)).

The FIR filter 114 receives the even and odd signals output by the PISO 202. In the example, the FIR filter 114 includes three taps that provide main-, pre-, and post-cursors for each of the even and odd signals (referred to as even and odd main-, pre-, and post-cursors). The FIR filter 114 outputs a plurality of logic signals that provide the even and odd main-, pre-, and post-cursors. In particular, the FIR filter 114 outputs logic signals for each of the odd pre-cursor ("pre-cursor odd"), the even pre-cursor ("pre-cursor even"), the odd main-cursor ("main-cursor odd"), the even main-cursor ("main-cursor even"), the odd post-cursor ("post-cursor odd"), and the even post-cursor ("post-cursor even"). Each of the logic signals output by the FIR filter 114 has a period 2T.

The pre-driver 115 includes multiplexers 2041 through 204N (collectively multiplexers 204) and multiplexing logic (MUX) 206. Each of the multiplexers 204 is a 2:1 multiplexer. The multiplexing logic 206 includes inputs receiving the odd pre-cursor signal, the even pre-cursor signal, the odd main-cursor signal, the even main-cursor signal, the odd post-cursor signal, and the even post-cursor signal. The multiplexing logic 206 includes 2T odd outputs coupled a first input of each of the multiplexers 204 and a 2T even output coupled to a second input of each of the multiplexers 204. Each 2T odd output of the multiplexing logic 206 provides complementary logic signals for one of the pre-cursor, main-cursor, or post-cursor odd signals. Each 2T even output of the multiplexing logic 206 provides complementary logic signals for one of the pre-cursor, main-cursor, or post-cursor even signals. The inputs of each multiplexer 204 are alternately coupled to its output at a rate of 1/T. Thus, the output of each multiplexer 204 provides complementary logic signals having a period T. For clarity, control inputs of the multiplexers 204 are omitted from the drawing. Control inputs of the multiplexers 204 are coupled to a clock signal to select between the even and odd inputs at a rate of 1/T.

The output driver 118 includes a plurality of output circuits 208 (e.g., N output circuits). As discussed above, each of the pre-cursor, main-cursor, and post-cursor signals is coupled to a certain percentage of the output circuits 208 of the output driver 118. The MUX logic 206 is configured to distribute the pre-, main-, and post-cursor signals among the multiplexers 204, which feed the output circuits 208. The MUX logic 206 can couple logic signals for any of the pre-cursor, the main-cursor, or the post-cursor to any of the multiplexers 204. The MUX logic 206 includes a control input coupled to the control logic 150. The control logic 150 configures the MUX logic 206 to couple logic signals for the pre-cursor to a selected number of the multiplexers 204, logic signals for the post-cursor to a selected number of the multiplexers 204, and logic signals for the main-cursor to a selected number of the multiplexers 204. The multiplexers 204 convert the 2T outputs of the multiplexing logic 206 to 1T inputs of the output circuits 208.

Figure 3:
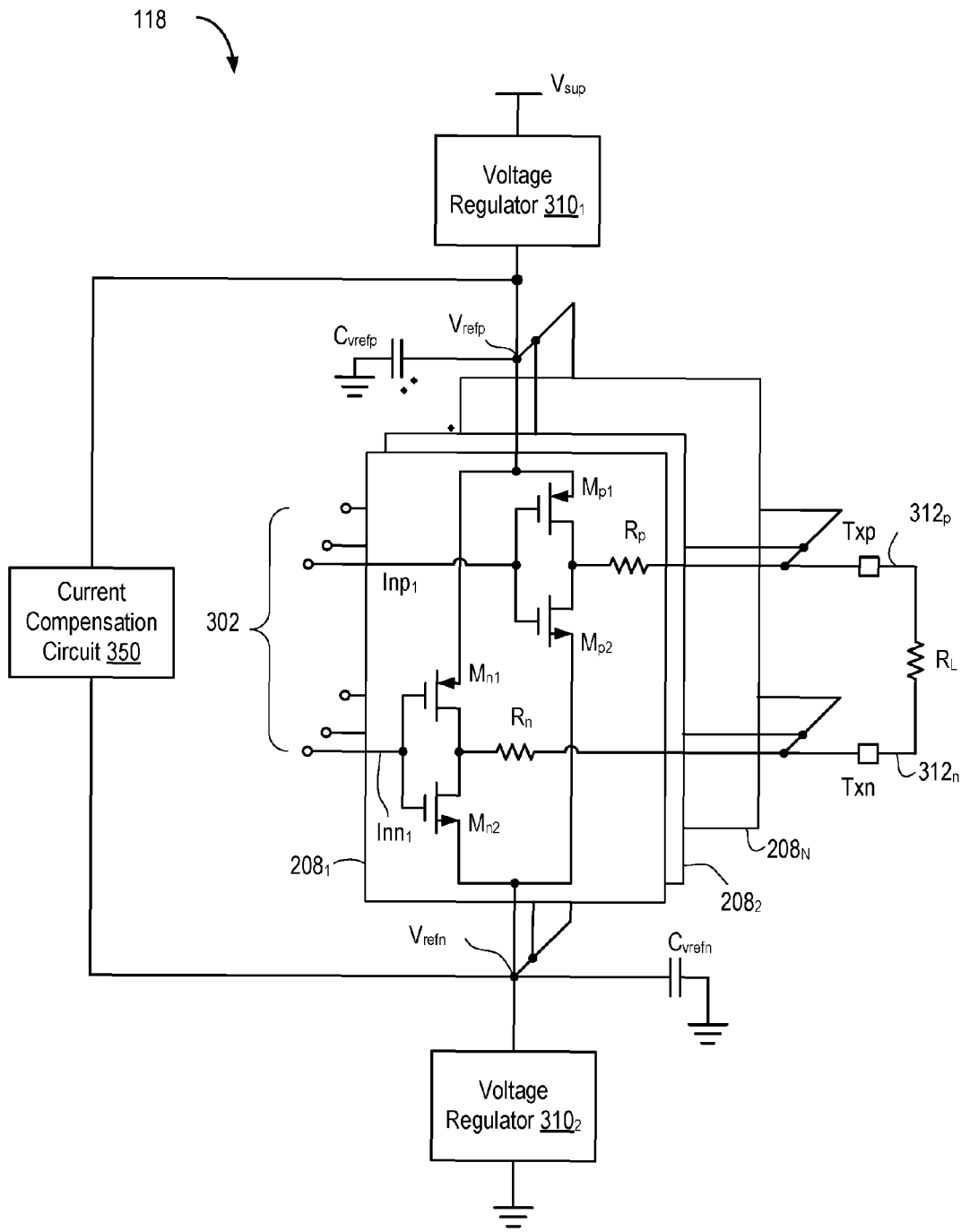
FIG. 3 is a schematic diagram depicting an output driver according to an example.

FIG. 3 is a schematic diagram depicting the output driver 118 according to an example. The output driver 118 includes output circuits $208_1$ through $208_N$ (where N is an integer greater than one), voltage regulators $310_1$ and $310_2$, and a current compensation circuit 350. The output circuits $208_1$ through $208_N$ are collectively referred to as output circuits 208, and the voltage regulators $310_1$ and $310_2$ are collectively referred to as voltage regulators 310.

The output circuits 208 are coupled in parallel between common nodes $V_{refp}$ and $V_{refn}$ (also referred to as supply voltage nodes). The output circuits 208 include a differential input 302 and a differential output (Txp, Txn). The differential input 302 includes N differential signals output by the pre-driver 115. Each differential signal includes a true logic signal, Inp, and a complement logic signal, Inn. Thus, the differential input 302 includes logic signals $Inp_1$ through $Inp_N$ and logic signals $Inn_1$ through $Inn_N$.

Each of the output circuits 208 includes transistors $M_{p1}$, $M_{p2}$, $M_{n1}$, and $M_{n2}$. Each of the output circuits 208 also includes resistors $R_p$ and $R_n$. The transistors $M_{p1}$ and $M_{n1}$ comprise p-channel field effect transistors (FETs), such as P-type metal-oxide semiconductor FETs (MOSFETs) (also referred to as PMOS transistors). The transistors $M_{p2}$ and $M_{n2}$ comprise n-channel FETs, such as N-type MOSFETs (also referred to as NMOS transistors). For purposes of clarity, only the output circuit $208_1$ is shown in detail. However, each of the output circuits $208_2$ through $208_N$ are configured identically with the output circuit $208_1$.

Sources of the transistors $M_{p1}$ and $M_{n1}$ are coupled to the common node $V_{refp}$. Drains of the transistors $M_{p1}$ and $M_{n1}$ are coupled to drains of the transistors $M_{p2}$ and $M_{n2}$, respectively. Sources of the transistors $M_{p2}$ and $M_{n2}$ are coupled to the common node $V_{refn}$. Gates of the transistors $M_{p1}$ and $M_{p2}$ are coupled together and are coupled to receive a logic signal Inp of one of the input differential signals. Gates of the transistors $M_{n1}$ and $M_{n2}$ are coupled together and are coupled to receive a logic signal Inn of one of the input differential signals. A first terminal of the resistor $R_p$ is coupled to the drains of the transistors $M_{p1}$ and $M_{p2}$, and a second terminal of the resistor $R_p$ is coupled to the node Txp of the differential output. A first terminal of the resistor $R_n$ is coupled to the drains of the transistors $M_{n1}$ and $M_{n2}$, and a second terminal of the resistor $R_n$ is coupled to the node Txn of the differential output. The transistors $M_{p1}$ and $M_{p2}$ form a first logic inverter ($M_p$), and the transistors $M_{n1}$ and $M_{n2}$ form a second logic inverter ($M_n$). A series combination of the pair of logic inverters ($M_p$, $M_n$) and the pair of resistors $R_p$ and $R_n$ is coupled between a respective differential input and the differential output (Txp, Txn). The source terminals of the logic inverters are coupled between the common nodes $V_{refp}$ and $V_{refn}$.

The voltage regulator $310_1$ is coupled to the common node $V_{refp}$. The voltage regulator $310_1$ controls the voltage at the node $V_{refp}$ and supplies current to the output circuits 208. The voltage regulator $310_2$ is coupled to the common node $V_{refn}$. The voltage regulator $310_2$ controls the voltage at the node $V_{refn}$ and sinks current from the output circuits 208 (e.g., supplies a negative current to the output circuits 208). The voltage regulator $310_1$ is coupled to a first supply voltage $V_{refp}$, and the voltage regulator $310_2$ is coupled to a second supply voltage (e.g., electrical ground).

The output driver 118 further includes capacitors $C_{vrefp}$ and $C_{vrefn}$. The capacitor $C_{vrefp}$ is coupled between the node $V_{refp}$ and electrical ground. The capacitor $C_{vrefn}$ is coupled between the node $V_{refn}$ and electrical ground.

The differential output (Txp, Txn) is coupled to a pair of transmission lines $312_p$ and $312_n$ (collectively transmission lines 312). The transmission lines 312 drive a load resistance $R_L$. The transmission lines 312 and the load resistance $R_L$ are not part of the output driver 118. Rather, the transmission lines 312 are part of the transmission medium 160 and the load resistance $R_L$ is part of the receiver 126.

In operation, each output circuit 208 includes a pair of logic inverters driven complementary logic signals (a differential signal of the differential input 302). Each differential signal of the differential input 302 can be one of a main-cursor signal, a post-cursor signal, or a pre-cursor signal. As discussed above, the pre-driver 115 controls the number of output circuits 208 receiving each of the main-cursor, post-cursor, and pre-cursor signals. For example, the output circuits 208 can receive all main-cursor signals, some main-cursor signals and some pre-cursor signals, some main-cursor signals and some post-cursor signals, or some main-cursor signals, some post-cursor signals, and some pre-cursor signals. Mixing post/pre-cursor signals with the main-cursor signals is used to implement pre-emphasis equalization in the transmitter 112.

The voltage regulators 310 set the swing of the output driver 118. The differential peak-to-peak swing is based on $V_{refp}$-$V_{refn}$. With the dual regulators $310_1$ and $310_2$ in the output driver 118, the swing and common-mode can be set independently. For example, for a common-mode of 0.45 V and an output swing of 0.6 V, $V_{refp}$ is set to 0.75 V and $V_{refn}$ is set to 0.15 V. In the output driver 118, equalization can be implemented by driving a different number of the output circuits 208 with different main/pre/post cursor signals. With the dual-regulator approach, the swing is changed by adjusting the regulator voltage. Thus, equalization control is independent of the swing control. This allows for high FIR resolution even in low-swing mode.

The output circuits 208 draw a data-dependent current from the voltage regulators 310. The current drawn from the voltage regulators 310 is inversely proportional to the magnitude of the differential output voltage. The magnitude of the differential output voltage itself depends on the state of the main-, pre-, and post-cursors. When the main-cursor has a different state than the pre-cursor and/or post-cursor, the magnitude of the differential output voltage is large and the supplied current is small. That is, the magnitude of the differential output voltage is large and the supplied current is small whenever a bit of the main-cursor (1T) signal is different from its previous and/or subsequent bit. Conversely, when the main-cursor has the same state as the pre-cursor and/or post-cursor, the magnitude of the differential output voltage is small and the supplied current is large. That is, the magnitude of the differential output voltage is small and the supplied current is large whenever a bit of the main-cursor (1T) signal is the same as its previous and/or subsequent bit. The difference between the "large" current and the "small" current (i.e., the current swing) can be large enough to degrade the deterministic jitter of the transmitter 112.

The current compensation circuit 350 is coupled between the common nodes $V_{refp}$ and $V_{refn}$. The current compensation circuit 350 is controllable (e.g., using the control logic 150) to draw a selected current from the voltage regulator $310_1$ (and sinked by the voltage regulator $310_2$). The control logic 150 can control the current compensation circuit 350 to equalize the average current supplied by the voltage regulator $310_1$ and sinked by the voltage regulator $350_2$. The current compensation circuit 350 is controlled to minimize the current swing and maintain the deterministic jitter performance of the transmitter 112. An example of the current compensation circuit 350 is described below with respect to FIG. 4.

Figure 4:
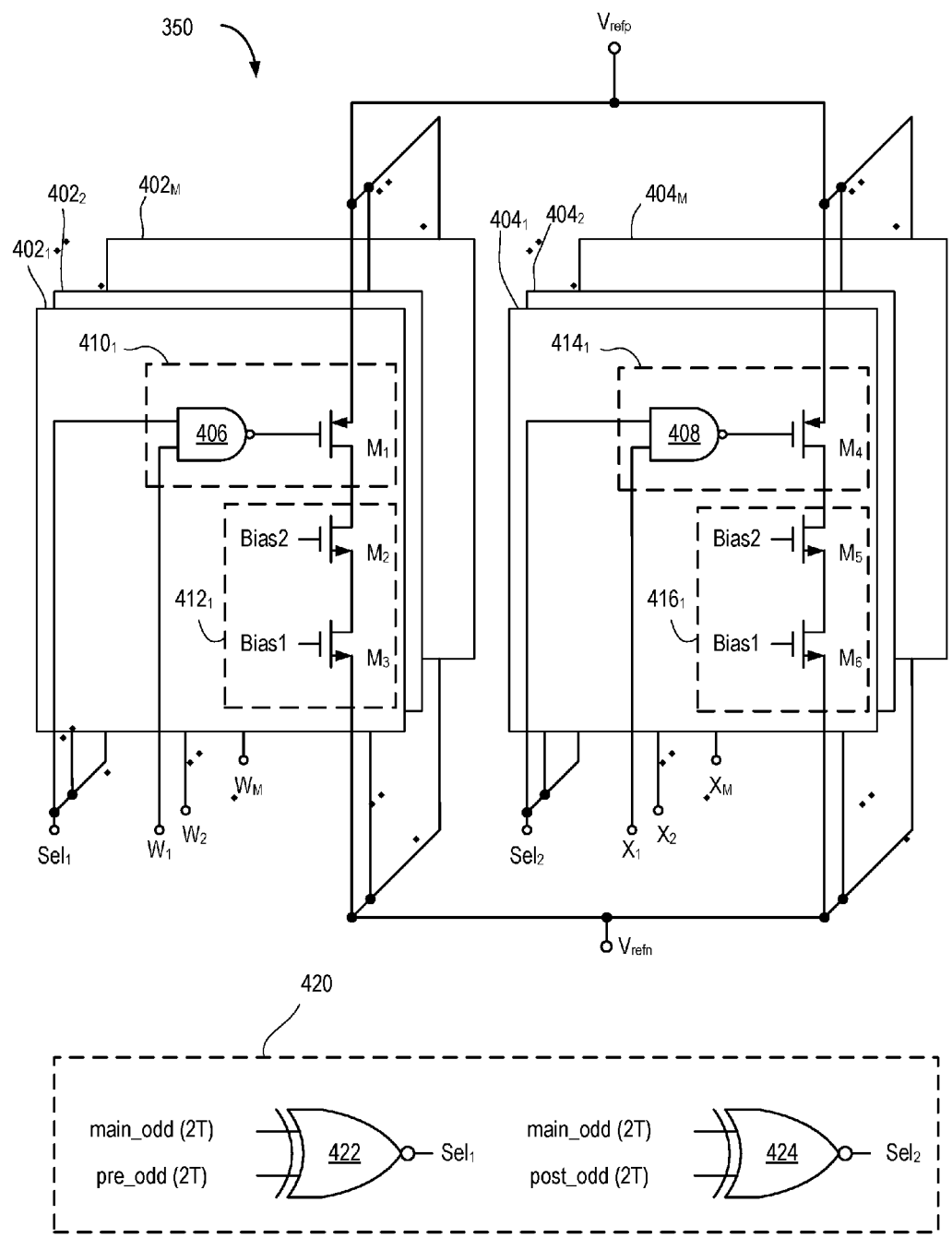
FIG. 4 is a schematic diagram depicting a current compensation circuit of the output driver of FIG. 3.

FIG. 4 is a schematic diagram depicting the current compensation circuit 350 according to an example. In general, the current compensation circuit 350 includes an event detector 420 and a branch circuit 402 that is coupled between the common nodes $V_{refp}$ and $V_{refn}$. The branch circuit 402 includes a switch 410 coupled to a current source 412. The series combination of the switch 410 and the current source 412 is coupled between the common nodes $V_{refp}$ and $V_{refn}$. The event detector 420 is coupled to the switch 410 to supply a logic signal referred to as an enable signal ($Sel_1$). The event detector 420 controls the state of the enable signal ($Sel_1$) based on presence of a pattern in logic signals output by the FIR filter 114.

In particular, the event detector 420 detects a pattern in a plurality of 2T logic signals output by the FIR filter 114 that occurs when the state of a current symbol of the serial data is different from that of a delayed symbol and/or advanced symbol. Upon detecting the pattern, the event detector 420 controls the enable signal ($Sel_1$) to close the switch 410, which couples the current source 412 between the common nodes $V_{refp}$ and $V_{refn}$. The current source 412 is controlled to draw a known amount of current from the voltage regulators 310. Upon absence of the pattern, the event detector 420 controls the enable signal ($Sel_1$) to open the switch 410, which decouples the current source 412 between the common nodes $V_{refp}$ and $V_{refn}$. In this manner, the average current drawn from the voltage regulators 310 is controlled based on the state of the serial data to minimize its effect on deterministic jitter of the transmitter 112.

In an example, the current compensation circuit 350 generally includes M branch circuits 402 coupled in parallel, e.g., branch circuits $402_1$ through $402_M$, where M is a positive integer. The switch 410 generally includes switch circuits $410_1$ through $410_M$. Likewise, the current source 412 includes current source circuits $412_1$ through $412_M$. The branch circuits $402_1$ through $402_M$ respectively include the switch circuits $410_1$ through $410_M$ and the current source circuits $412_1$ through $412_M$. When M is greater than one, the switch circuits $410_1$ through $410_M$ are responsive to the enable signal ($Sel_1$) and individual enable signals $W_1$ through $W_M$, which are logic signals that can be generated by the control logic 150. In operation, when the event detector 420 detects the pattern, the event detector 420 enables a selected number of the current source circuits $412_1$ through $412_M$ as controlled by the control logic 150. The individual enable signals $W_1$ through $W_M$ thus control the weight of the current drawn by the branch circuits $402_1$ through $402_M$. The branch circuits $402_1$ through $402_M$ implement a current-output digital-to-analog converter (DAC) that generates an analog current in response to the enable signal ($Sel_1$) and a digital signal formed by the logic signals $W_1$ through $W_M$ (e.g., an M-bit digital code selecting from $2^M$ current levels). The strength of the DAC can be programmed to match the strength of the equalization.

The event detector 420 includes a logic gate 422 configured to generate the enable signal ($Sel_1$). In the example shown, the logic gate 422 is an exclusive NOR (XNOR) gate. One input of the logic gate 422 is coupled to receive the 2T odd main-cursor (designated main_odd (2T)). Another input of the logic gate 422 is coupled to receive the 2T odd pre-cursor (designated pre_odd (2T)). The logic signal output by the logic gate 422 is logic "0" when state of the odd main-cursor signal is different than the state of the odd pre-cursor signal. The logic signal output by the logic gate 422 is logic "1" when the state of the odd main-cursor signal is the same as the state of the odd pre-cursor signal. As such, the logic gate 422 detects a pattern where state of the odd main-cursor signal is different than the state of the odd pre-cursor signal, which indicates that a bit of the 1T main-cursor signal is different from its previous bit. Upon detecting the pattern, the logic gate 422 asserts the enable signal, which enables activation of one or more branch circuits 402. Since the current compensation circuit 350 equalizes the average current drawn from the supplies, the current compensation circuit 250 can use 2T signals to detect the pattern, rather than the 1T signals, which is more energy efficient.

FIG. 5A is a table illustrating an example portion of a 1T main-cursor signal and its associated 2T odd signals. In the example, the 1T main-cursor signal has a bit sequence 0011100010 for discrete times 2n+1 through 2n+10, where n is an integer. The 2T odd main-cursor signal includes the bits from the odd discrete times 2n+1, 2n+3, . . . ,2n+9, which is the bit pattern 01101. The 2T odd post-cursor signal is the bit pattern 01000 for odd discrete times 2n+1, 2n+3, . . . ,2n+9. The 2T odd pre-cursor signal is the bit pattern 0100 for the odd discrete times 2n+3, 2n+5, . . . ,2n+9. The shaded boxes show where the 2T odd main-cursor is different from the 2T odd pre-cursor and/or the 2T odd post-cursor. This occurs at discrete times 2n+3, 2n+5, and 2n+9. The logic gate 422 in the example of FIG. 4 asserts the enable signal ($Sel_1$) at discrete times 2n+3 and 2n+9 when detecting a state difference between the 2T odd main-cursor and the 2T odd pre-cursor.

Returning to FIG. 4, the logic gate 422 looks for a pattern indicative of a bit of the 1T main-cursor signal being different from its previous bit. The event detector 420 can also include a logic gate 424 that looks for a pattern indicative of a bit of the 1T main-cursor signal being different from its subsequent bit. In the example shown, the logic gate 424 is an XNOR gate. The logic gate 424 outputs a logic signal referred to as an enable signal ($Sel_2$). One input of the logic gate 424 is coupled to receive main_odd (2T). Another input of the logic gate 424 is coupled to receive the 2T odd post-cursor (designated post_odd (2T)). The logic signal output by the logic gate 424 is logic "0" when state of the odd main-cursor signal is different than the state of the odd post-cursor signal. The logic signal output by the logic gate 424 is logic "1" when the state of the odd main-cursor signal is the same as the state of the odd post-cursor signal. As such, the logic gate 424 detects a pattern where state of the odd main-cursor signal is different than the state of the odd post-cursor signal, which indicates that a bit of the 1T main-cursor signal is different from its subsequent bit. Upon detecting the pattern, the logic gate 424 asserts the enable signal ($Sel_2$). In the example of FIG. 5A, the logic gate 424 asserts the enable signal ($Sel_2$) at discrete times 2n+5 and 2n+9.

The enable signal ($Sel_2$) is used to control another resistance coupled in parallel with the current source 412. In particular, the current compensation circuit 350 includes at least one branch circuit 404 that is coupled between the common nodes $V_{refp}$ and $V_{refn}$. The branch circuit(s) 404 provide a switch 414 coupled in series with a current source 416. The series combination of the switch 414 and the current source 416 is coupled between the common nodes $V_{refp}$ and $V_{refn}$. The event detector 420 is coupled to the switch 414 to supply the enable signal ($Sel_2$).

In an example, the current compensation circuit 350 generally includes M branch circuits 404 coupled in parallel, e.g., branch circuits $404_1$ through $404_M$. The switch 414 generally includes switch circuits $414_1$ through $414_M$. Likewise, the current source 416 includes current source circuits $416_1$ through $416_M$. The branch circuits $404_1$ through $404_M$ respectively include the switch circuits $414_1$ through $414_M$ and the current source circuits $416_1$ through $416_M$. When M is greater than one, the switch circuits $414_1$ through $414_M$ are responsive to the enable signal ($Sel_2$) and individual enable signals $X_1$ through $X_M$, which are logic signals that can be generated by the control logic 150. The branch circuits $404_1$ through $404_M$ implement another current-output DAC that generates an analog current in response to the enable signal ($Sel_2$) and a digital signal formed by the logic signals $X_1$ through $X_M$ (e.g., an M-bit digital code selecting from $2^M$ current levels).

In an example, each switch circuit $410_1$ through $410_M$ includes a logic gate 406 and a transistor $M_1$. In the example shown, the logic gate 406 is a NAND gate and the transistor $M_1$ is a p-channel FET, such as a PMOS transistor. An output of the logic gate 406 is coupled to a gate of the transistor $M_1$. A source of the transistor $M_1$ is coupled to the common node $V_{refp}$. A drain of the transistor $M_1$ is coupled to a respective current source circuit $412_1$ through $412_M$. One input of the logic gate 406 receives the enable signal ($Sel_1$). Another input of the logic gate 406 receives one of the individual enable signals W<M:1>.

Likewise, each switch circuit $414_1$ through $414_M$ includes a logic gate 408 and a transistor $M_4$. In the example shown, the logic gate 408 is a NAND gate and the transistor $M_4$ is a p-channel FET, such as a PMOS transistor. An output of the logic gate 408 is coupled to a gate of the transistor $M_4$. A source of the transistor $M_4$ is coupled to the common node $V_{refp}$. A drain of the transistor $M_4$ is coupled to a respective current source circuit $416_1$ through $416_M$. One input of the logic gate 408 receives the enable signal ($Sel_2$). Another input of the logic gate 408 receives one of the individual enable signals X<M:1>.

In an example, each current source circuit $412_1$ through $412_M$ includes a transistor $M_2$ and a transistor $M_3$. A drain of the transistor $M_2$ is coupled to a drain of the transistor $M_1$. A source of the transistor $M_2$ is coupled to a drain of the transistor $M_3$. A source of the transistor $M_3$ is coupled to the common node $V_{refn}$. A gate of the transistor $M_2$ is coupled to a bias node (Bias2). A gate of the transistor $M_3$ is coupled to a bias node (Bias1). Likewise, each current source circuit $416_1$ through $416_M$ includes a transistor $M_5$ and a transistor $M_6$. A drain of the transistor $M_5$ is coupled to a drain of the transistor $M_4$. A source of the transistor $M_5$ is coupled to a drain of the transistor $M_6$. A source of the transistor $M_6$ is coupled to the common node $V_{refn}$. A gate of the transistor $M_5$ is coupled to a bias node (Bias2). A gate of the transistor $M_6$ is coupled to a bias node (Bias1). The transistors $M_2$, $M_3$, $M_5$, and $M_6$ are n-channel FETs, such as NMOS transistors. The transistors $M_2$, $M_3$, $M_5$, and $M_6$ are biased into saturation by the bias voltages Bias1 and Bias2.

In the example of FIG. 4, the event detector 420 compares the 2T odd main-cursor signal with the respective 2T odd pre- and post-cursor signals. In other examples, the event detector 420 can compare the 2T even main-cursor signal with the respective 2T even pre- and post-cursor signals. FIG. 5B is a table illustrating an example portion of a 1T main-cursor signal and its associated 2T even signals. In the example, the 1T main-cursor signal has the same bit sequence 0011100010 for discrete times 2n+1 through 2n+10 as shown in FIG. 5A. The 2T even main-cursor signal includes the bits from the even discrete times 2n+2, 2n+4, . . . ,2n+10, which is the bit pattern 01000. The 2T even post-cursor signal is the bit pattern 1101 for even discrete times 2n+2, 2n+4, . . . ,2n+8. The 2T even pre-cursor signal is the bit pattern 01101 for the even discrete times 2n+2, 2n+4, . . . ,2n+10. The shaded boxes show where the 2T even main-cursor is different from the 2T even pre-cursor and/or the 2T even post-cursor. This occurs at discrete times 2n+2, 2n+4, 2n+6, 2n+8, and 2n+10. The event detector 420 can be configured to assert the enable signal ($Sel_1$) at discrete times 2n+6 and 2n+10, and assert the enable signal ($Sel_2$) at discrete times 2n+2 and 2n+8.

While the foregoing is directed to specific examples, other and further examples may be devised without departing from the basic scope thereof, and the scope thereof is determined by the claims that follow.

What is claimed is:

1. An output driver, comprising:
a plurality of output circuits coupled in parallel between a first voltage supply node and a second voltage supply node, each of the plurality of output circuits including a differential input that is coupled to receive a logic signal of a plurality of logic signals and a differential output that is coupled to a common output node;
at least one voltage regulator coupled to a respective at least one of the first voltage supply node and the second voltage supply node;
a current compensation circuit, including:
a switch coupled in series with a current source, the series combination of the switch and the current source coupled between the first voltage supply node and the second voltage supply node; and
an event detector coupled to the switch to supply an enable signal, the event detector configured to control state of the enable signal based on presence of a pattern in the plurality of logic signals, wherein the event detector comprises a logic gate configured to compare a first logic signal of the plurality of logic signals with a second logic signal of the plurality of logic signals to generate the enable signal.

2. The output driver of claim 1, wherein:
the switch and the current source are a first switch and a first current source, respectively;
the enable signal is a first enable signal and the event detector is configured to control the state of the first enable signal based on presence of a pattern in a first logic signal and a second logic signal of the plurality of logic signals;
the current compensation circuit further includes a second switch coupled in series with a second current source, the series combination of the second switch and the second current source coupled between the first voltage supply node and the second voltage supply node; and
the event detector is coupled to the second switch to supply a second enable signal, the event detector configured to control state of the second enable signal based on presence of a pattern in the first logic signal and a third logic signal of the plurality of logic signals.

3. The output driver of claim 1, wherein:
the current source includes a plurality of current source circuits and the switch includes a plurality switch circuits respectively coupled in series with the plurality of current source circuits;
the enable signal is a common enable signal; and
each of the plurality of switch circuits is responsive to the common enable signal and a respective one of a plurality of individual enable signals.

4. The output driver of claim 3, wherein each of the plurality of switch circuits includes:
a transistor coupled in series with a respective one of the plurality of current source circuits and a logic gate coupled to a gate of the transistor, the logic gate having a first input coupled to receive the common enable signal and a second input coupled to receive a respective one of the plurality of individual enable signals.

5. The output driver of claim 4, wherein each of the plurality of current source circuits of the current source includes:
a first transistor in series with a second transistor, the first transistor including a gate coupled to a first bias node and the second transistor including a gate coupled to a second bias node.

6. The output driver of claim 1, wherein the first logic signal is generated from a current state of input data and the second logic signal is generated from a delayed state or an advanced state of the input data with respect to the current state.

7. The output driver of claim 6, wherein the pattern of the plurality in logic signals occurs when the current state of the input data is different from at least one of the delayed state and the advanced state of the input data, and wherein the event detector is configured to set the state of the enable signal to close the switch in response to detection of the pattern and to open the switch in response to absence of the pattern.

8. The output driver of claim 1, wherein the each of the plurality of output circuits includes a series-source terminated (SST) driver circuit.

9. A transmitter, comprising:
an finite impulse response (FIR) filter configured to supply a plurality of logic signals in response to input data; and
a pre-driver configured to couple the plurality of logic signals to an output driver, the output driver including:
a plurality of output circuits coupled in parallel between a first voltage supply node and a second voltage supply node, each of the plurality of output circuits including a differential input that is coupled to receive a logic signal of the plurality of logic signals and a differential output that is coupled to a common output node;
at least one voltage regulator coupled to a respective at least one of the first voltage supply node and the second voltage supply node;
a current compensation circuit, including:
a switch coupled in series with a current source, the series combination of the switch and the current source coupled between the first voltage supply node and the second voltage supply node; and an event detector coupled to the switch to supply an enable signal, the event detector configured to control state of the enable signal based on presence of a pattern in the plurality of logic signals, wherein the event detector comprises a logic gate configured to compare a first logic signal of the plurality of logic signals with a second logic signal of the plurality of logic signals to generate the enable signal.

10. The transmitter of claim 9, wherein:
the switch and the current source are a first switch and a first current source, respectively;
the enable signal is a first enable signal and the event detector is configured to control the state of the first enable signal based on presence of a pattern in a first logic signal and a second logic signal of the plurality of logic signals;
the current compensation circuit further includes a second switch coupled in series with a second current source, the series combination of the second switch and the second current source coupled between the first voltage supply node and the second voltage supply node; and
the event detector is coupled to the second switch to supply a second enable signal, the event detector configured to control state of the second enable signal based on presence of a pattern in the first logic signal and a third logic signal of the plurality of logic signals.

11. The transmitter of claim 9, wherein:
the current source includes a plurality of current source circuits and the switch includes a plurality switch circuits respectively coupled in series with the plurality of current source circuits;
the enable signal is a common enable signal; and
each of the plurality of switch circuits is responsive to the common enable signal and a respective one of a plurality of individual enable signals.

12. The transmitter of claim 11, wherein each of the plurality of switch circuits includes:
a transistor coupled in series with a respective one of the plurality of current source circuits and a logic gate coupled to a gate of the transistor, the logic gate having a first input coupled to receive the common enable signal and a second input coupled to receive a respective one of the plurality of individual enable signals.

13. The transmitter of claim 12, wherein each of the plurality of current source circuits of the current source includes:

a first transistor in series with a second transistor, the first transistor including a gate coupled to a first bias node and the second transistor including a gate coupled to a second bias node.

14. The transmitter of claim 9, wherein the FIR filter is configured to generate the first logic signal from a current state of the input data and the second logic signal from a delayed state or an advanced state of the input data with respect to the current state.

15. The transmitter of claim 14, wherein the pattern of the plurality in logic signals occurs when the current state of the input data is different from at least one of the delayed state and the advanced state of the input data, and wherein the event detector is configured to set the state of the enable signal to close the switch in response to detection of the pattern and to open the switch in response to absence of the pattern.

16. The transmitter of claim 9, wherein the each of the plurality of output circuits includes a series-source terminated (SST) driver circuit.

17. A method of controlling an output driver in a transmitter, comprising:
receiving a plurality of logic signals from an equalizer in the transmitter;
coupling each of the plurality of logic signals to at least one of a plurality of output circuits of the output driver, the plurality of output circuits coupled between a first voltage supply node and a second voltage supply node, at least one of the first voltage supply node and the second voltage supply node coupled to a voltage regulator;
detecting a pattern in the plurality of logic signals; and
enabling at least one of a plurality of current sources coupled between the first voltage supply node and the second voltage supply node,
wherein the first logic signal is generated from a current state of input data to the equalizer and the second logic signal is generated from a delayed state or an advanced state of the input data with respect to the current state, wherein the pattern of the plurality in logic signals occurs when the current state of the input data is different from at least one of the delayed state and the advanced state of the input data, and wherein the at least one current source is enabled in response to detection of the pattern and disabled in response to absence of the pattern.

* * * * *